United States Patent [19]

Chu et al.

[11] 4,104,719
[45] Aug. 1, 1978

[54] MULTI-ACCESS MEMORY MODULE FOR DATA PROCESSING SYSTEMS

[75] Inventors: Wesley W. Chu, Pacific Palisades, Calif.; Phillip B. Korff, Falls Church, Va.

[73] Assignee: The United States of America as represented by the Secretary of the Navy, Washington, D.C.

[21] Appl. No.: 687,977

[22] Filed: May 20, 1976

[51] Int. Cl.² .................... G06F 13/00; G11C 7/00
[52] U.S. Cl. ................................ 364/200; 365/230
[58] Field of Search .......... 340/172.5, 173 FF, 173 R; 307/238; 364/200 MS File, 900 MS FILE; 365/230, 238

[56] References Cited

U.S. PATENT DOCUMENTS

| | | | |
|---|---|---|---|
| 3,394,354 | 7/1968 | Senzig | 364/200 |
| 3,466,611 | 9/1969 | Weinberger | 364/200 |
| 3,629,853 | 12/1971 | Newton | 340/172.5 |
| 3,638,199 | 1/1972 | Kolankowsky et al. | 364/200 |
| 3,638,204 | 1/1972 | Kolankowsky | 340/173 FF |
| 3,642,236 | 2/1972 | Kolankowsky et al. | 340/173 R |
| 3,675,218 | 7/1972 | Sechler | 340/173 FF |
| 3,761,898 | | Pao | 340/173 R |
| 3,812,473 | 5/1974 | Tucker | 364/200 |

Primary Examiner—Melvin B. Chapnick
Attorney, Agent, or Firm—Richard S. Sciascia; Paul N. Critchlow

[57] ABSTRACT

Memory apparatus for use in a data processing system and which includes in its entirety a number of multi-access modules each formed of a plurality of data bit cells. Each module is accessed through multiple independent channels and each channel is capable of servicing a different request during the same memory cycle. Structurally, each independent channel is coupled by a drive line to a data bit storage cell and each drive line is energizable to close a switch mechanism for connecting a read-write bit line circuit to the cell. Individual cells have their own independent bit line circuits and switch mechanisms. Thus, plural requests for a read-out of a single cell can be serviced simultaneously. Special circuitry is suggested for resolving conflicts arising in situations involving simultaneous read-write or write requests addressed to a single cell.

2 Claims, 5 Drawing Figures

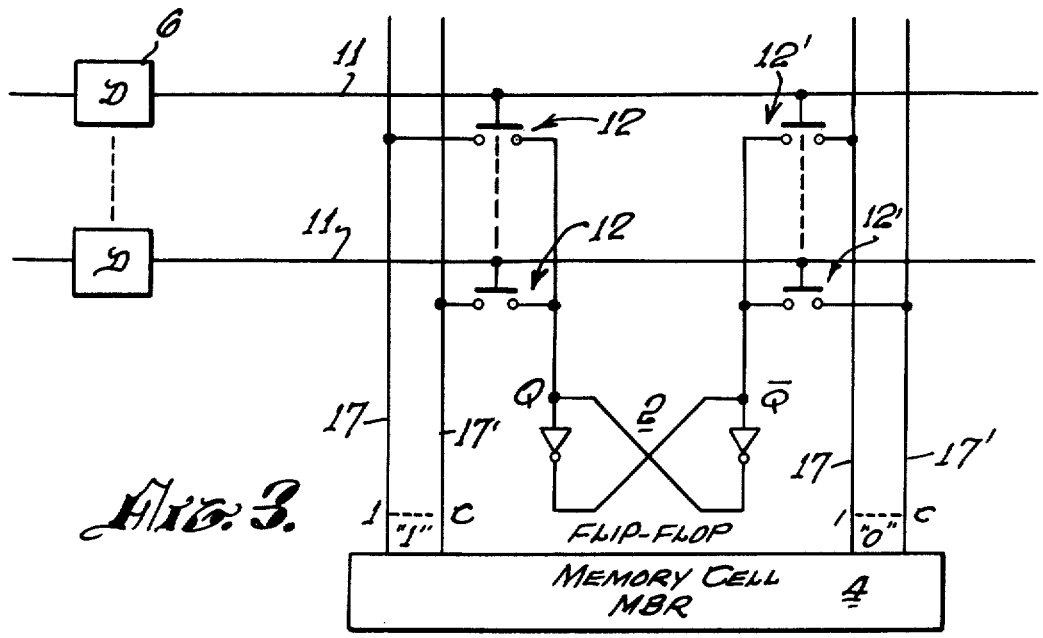
Fig. 3.
| CHANNEL 1 | CHANNEL 2 | ERROR |
|---|---|---|
| READ | READ | NO |
| READ | WRITE | YES |
| WRITE | READ | YES |
| WRITE | WRITE | YES |
Fig. 4.
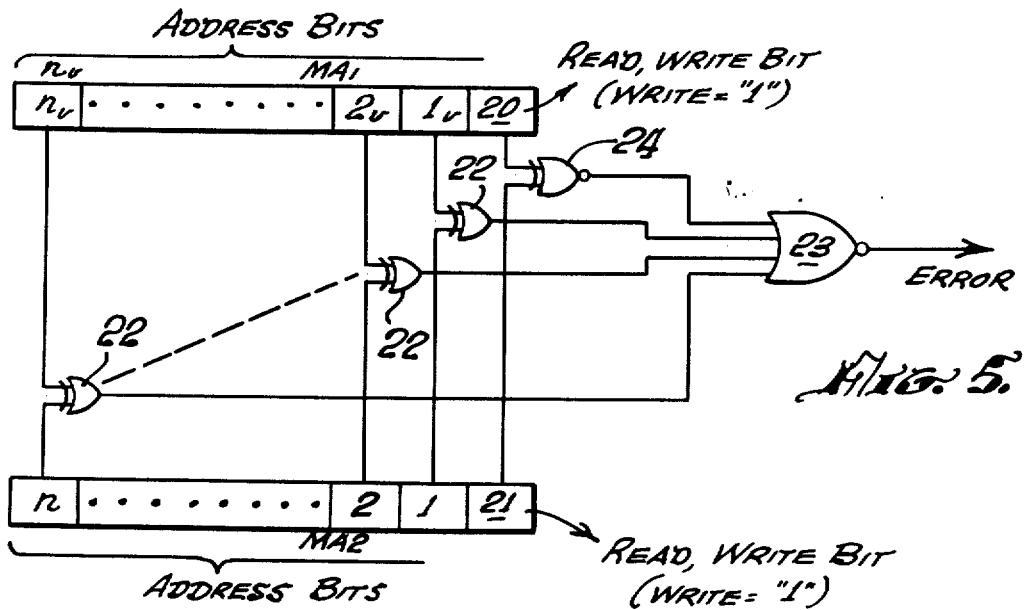
Fig. 5.

MULTI-ACCESS MEMORY MODULE FOR DATA PROCESSING SYSTEMS

BACKGROUND OF THE INVENTION

The present invention relates to data processing apparatus and, in particular, to memory apparatus for increasing the data processing rate.

Data processing rates continually increase due to advances made at both the logic and the architectural levels of the processing system. Whether considering program storage in main memory or micro-programmed control storage, these advances create an ever increasing demand for higher memory throughputs or, in other words, memory bandwidths. To satisfy this demand, storage space, for example, has been divided into independent, interleaved modules so that, in one memory cycle, the memory system has the potential to service as many requests (i.e., addresses) as there are modules. However, module conflicts occur whenever the same memory module is simultaneously accessed by more than one request. A number of previous studies have shown that memory throughput and processor efficiency can be seriously limited by storage interference. For example, certain studies have shown that, due to memory access conflicts, the average utilization of memory bandwidth of the system grows far less rapidly than the increase in the number of modules. Hellerman in a paper entitled "Digital Computer Systems Principles," McGraw-Hill, New York: 1967, pages 228-229, has demonstrated that M memory modules have a throughput roughly proportional to the $\sqrt{M}$ rather than to M itself. Such an inefficient use of bandwidth places a serious restriction on the number of memory modules and the processing rates.

The present invention effectively reduces the prior art limitations by employing the concept of multi-access. In general, the concept refers to the simultaneous, random access of more than one memory location within the same memory module. Physically considered, multi-access consists of independent multiple channels or ports for a single memory module where each port can service a single request in parallel with other ports of the same memory module.

The advantage of multi-access is that the increase in bandwidth utilization is at least directly proportional to the increase in the number of ports. As an example, in a memory structure consisting of an M number of modules with an N an number of independent channels or ports per module, bandwidth utilization of the multi-access system is approximately N times greater than that of the single port structure or, as previously pointed out, it becomes approximately $N\sqrt{M}$.

Another object of the present invention is that it contributes to increase reliability. Since each channel or port is independent of the others, a single channel or port failure no longer forces the faulty module to be excluded from the memory structure. In contrast, in interleaved systems which do not use the multi-channel concept, there is a loss of stored data as well as other problems associated with module loss.

BRIEF DESCRIPTION OF THE DRAWINGS

The present invention is illustrated in the accompanying drawings of which:

FIG. 3 is a view similar to FIG. 2 showing another form of the storage cell;

FIG. 4 is a Storage Error Table providing the conditions which can lead to location conflict for a single location in a two channel memory module, and FIG. 5 is a diagramatic illustration of a conflict-resolving comparator used to resolve location conflicts.

DETAILED DESCRIPTION OF THE INVENTION

Figure 1:
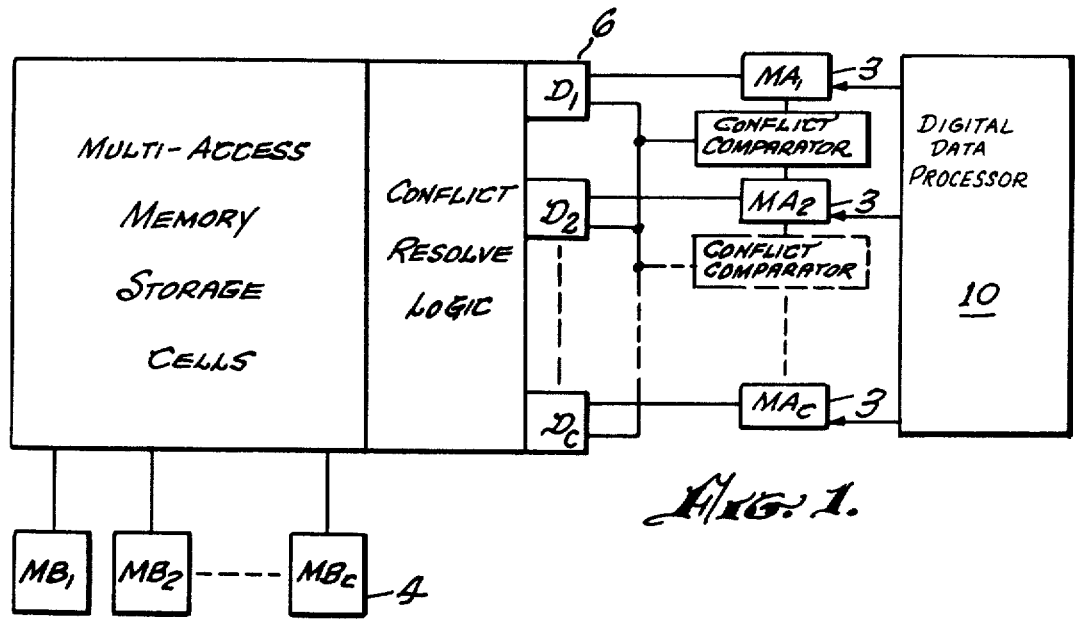
FIG. 1 is a schematic illustrating a single memory module or unit.
Figure 2:
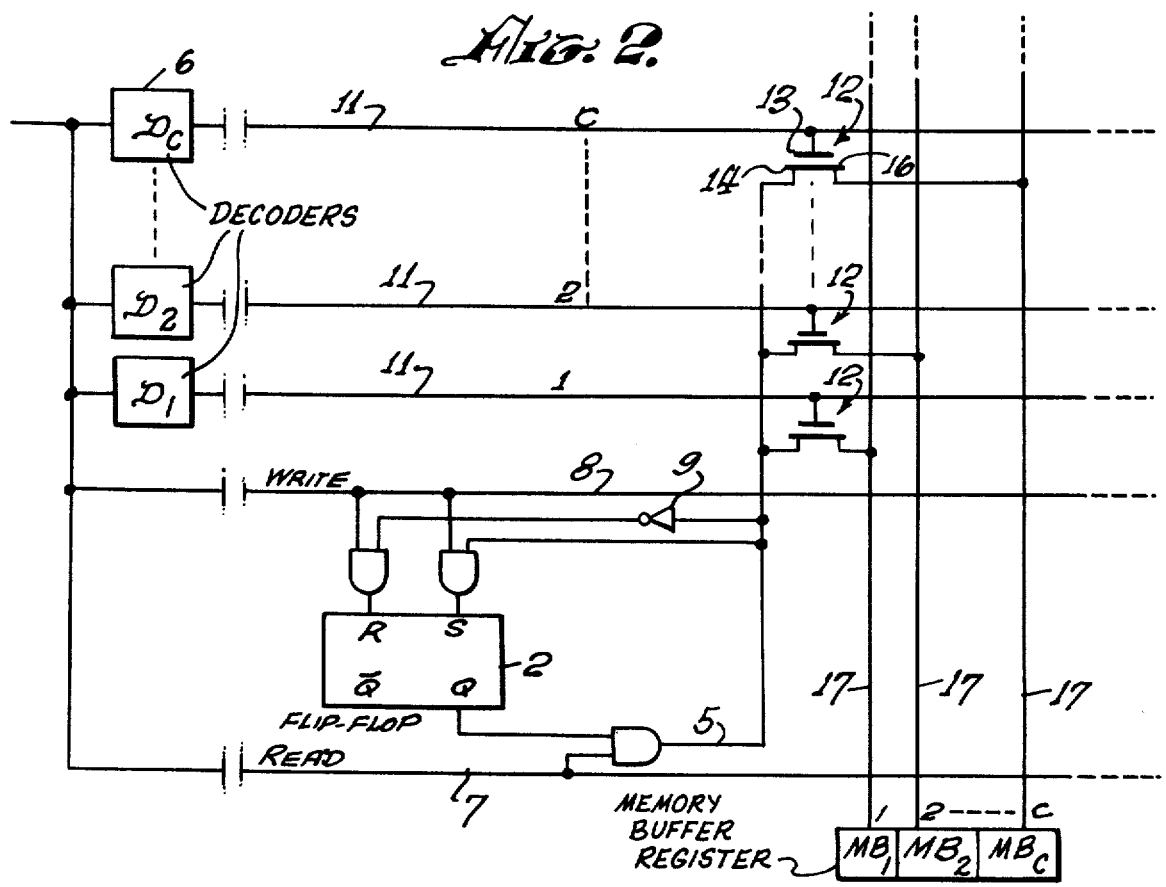
FIG. 2 is a somewhat schematic circuit diagram showing one form of a single multi-access storage cell of the module.

Before describing the present multi-access memory, it should be noted for purposes of simplicity, that the drawings do not attempt to illustrate the entire architectural complex wither of a complete memory or of the many storage cells used in each memory module. FIG. 1 illustrates a single memory module 1 which, as will be recognized, is but one of a great many identical modules together providing the memory of the system. Similarly, FIG. 2 shows a single storage cell 2 of one of the modules, and it will be understood that each module includes a large number of identical cells each of which contains an information bit. Such simplification is possible since, as will become clear, the present invention fundamentally is concerned with providing a multi-access capability for a single storage cell such as each cell 2 of each memory module of the memory system. The provision of the entire memory complex primarily is a design problem which can be resolved in accordance with known computer design principles.

It also will be recognized that the present invention provides a multi-access capability adapted for use in a wide variety of computer systems and processes. Consequently, components such as memory address registers 3 (FIG. 1), memory buffer registers 4 and decoders 6 are shown primarily for their functional significance. In other words, these components are of interest only because of their functions in establishing the necessary multi-access channels. Their particular implementation, of course, can be widely varied and, in fact, would vary widely depending upon the particular processor environment. As indicated in FIG. 1, a processor 10 communicates directly with address registers 3.

Memory module 1 can be considered as containing message units such as words to be accessed into memory buffer registers 4. As usual, each message unit or word in the module is formed of a plurality of separate logic bits with each bit of each word provided by a separate storage cell 2 (FIG. 2). A memory address, received from processor 10 and stored in a register 3, typically includes a binary number sequence the bits of which provide the location instruction or, as applied to the present arrangement, identify the location of the particular cells containing word to be accessed into buffer register 4. Further, unless the processor is of a read only type, the address customarily includes binary bits such as "1" or "0" which, respectively, may provide a command to the memory to either read out (sense) its information or to write certain information into the memory. Decoders 6 apply the instruction to the memory modules so that, in accordance with the instructions, signal levels can be applied to memory circuitry to achieve whatever result is required by the address instruction. For example, in a reading operation, the address and decoder customarily are used to establish the conditions for interrogating those particular storage cells identified by the instruction. Alternatively, if it is desired to write into a storage cell, the cell is forced into its desired logic state by establishing the proper signal level. Such functions, as well as a variety of others, are considered as routine or conventional operations which need no detailed description.

As shown in the drawings, multi-accessing of words in a single memory module, such as module 1, is accomplished through multiple independent access channels each of which includes an independent address register 3, a single decoder 6 and its own memory input-output register which has been identified as memory buffer register 4. As will be appreciated, there is one channel for each word to be accessed.

FIG. 2 shows a single memory cell 2 containing one bit of the word to be accessed. Many such cells make up each module. In particular, cells 2 are semi-conductor flip-flops, such as bistable multivibrators, in which a desired logic state can be established. Upon command, the cells can be sensed or read. In a write mode the flip-flop can be forced into a different cell state by application of a proper signal level. Conventionally, decoders, such as decoders 6, achieve this purpose by processing the address instruction of address registers, such as registers 3.

Considering cell 2 in greater detail, it will noted that it includes a pair of terminals Q and $\overline{Q}$ with the terminal gated to a conductive logic line 5 for retrieval purposes. In the illustrated arrangement decoders 6 typically provide control signals which are impressed on the cell through read and write lines 7 and 8. In the write operation, the flip-flop is set by gateably applying the signal to terminals "S" and "R" (set and reset) to establish the desired logic state at output Q. An inverter 9 is used at the reset terminal to establish $\overline{Q}$.

Functionally, it can be assumed that an address register 3 of channel C contains the address which, for example, calls for the $J^{th}$ word and it also includes a functional bit defining either a read or write operation. For the $J^{th}$ word, the decoder impresses a voltage on the channel C select line, and, depending on the functional bit, either on read line 7 or write line 8. In other words, the decoder impresses a voltage on a drive line 11 and, as may be noted, there are a plural number of drive lines each coupled in parallel to a decoder and each, importantly, including a semi-conductor switch mechanism 12 formed of a switch arm 13 and a pair of switch contacts 14 and 16. The voltage on line 11, in turn, closes switch 12 and establishes a closed bit line circuit between cell 2 and one of a plurality of bit lines 17. As will be noted, there is a bit line 17 for each channel 1, 2 — C of its arrangement. By definition, each bit-line-circuit extends from a buffer register, such as registers $MB_1$, $MB_2$ and $MB_c$, to each storage cell 2 for the purpose of accessing the binary state of the cell in either a read or write mode. Consequently, each of the so-called multiple channels of the multi-access system includes, in addition to its own address register, decoder and drive line, its own buffer register.

In a like manner, the impressing of the voltage on select or drive line 11 results in the connection of the channel C bit lines to all semi-conductor storage cells of the $J^{th}$ word to be accessed. Thus, the drive lines are used to activate the switches of all the bits forming the word to be accessed. As indicated, once the switches are closed, the bit lines can be used either to sense or to alter the current state of the word.

The principle feature of the invention is, as stated, that it provides a multi-accessing capability. Thus, due to the plurality of parallel channels 1, 2 — C, the arrangement provides the capability of accessing the cell bit information through different channels. Also, it obviously provides simultaneous access to more than one memory location within the same memory module. Or, viewed in another manner, to each storage cell of each memory module. As previously pointed out, the bandwidth utilizing the multi-access system is therefore N times greater than that of the single port structure, or, $N\sqrt{M}$.

Switches 12, most suitably, either are bipolar or MOS transistors which can be closed only when a drive line 11 is activated by the decoder. Semi-conductor switching and storage cells are used for the purpose of achieving electrical isolation of all cells in the array. One very real advantage of achieving complete isolation or independence is that it increases reliability in the event of a port failure. Thus, single port failures may result in some degradation of performance but will not force the faulty module to be excluded from the memory structure. Independency eliminates the loss of stored data and reduces the problems associated with module loss in an interleaved memory system.

FIG. 3 is provided to show an alternative storage cell arrangement which, in most processing environments, would be preferred. By way of comparison, the FIG. 2 cell maintains its simplicity by sampling the state of each bit at the Q output. However, the power drain on a single storage cell can be reduced materially, or the number of channels can be increased, by using the $\overline{Q}$ output of the flip-flops to drive half of the output bit lines. This end is achieved by coupling both the Q and $\overline{Q}$ terminals of the FIG. 3 cell to a separate switch 12. Consequently, each drive line 11 of each channel of FIG. 3 includes a pair of switches 12 both of which are activated by the voltage impressed on the line. Also, pairs of bit lines 17 and 17' are provided for each channel 1—C with one line of each pair having a "1" line coupled through one switch to the Q output. The other line of the pair is, as shown, an "0" line coupled through the other switch to the $\overline{Q}$ output. Since the $\overline{Q}$ terminal is used, the true form of the output of $\overline{Q}$ must be regained. Bit complementation achieved by the NAND gating shown in FIG. 3 accomplishes this purpose. Otherwise, the operation of the FIG. 3 arrangement is the same as that of FIG. 2 in that both cell arrangements provide the multi-accessing capability which is the principle feature of the invention. Other cell arrangements can be employed and, in fact, the physical structure of the cells is of concern only to the extent that the end purpose of the system can be achieved efficiently and with minimum power drains. In other words, any flip-flop arrangement which can be set and reset by an impressed voltage so that its Q or $\overline{Q}$ state can be sensed or altered is acceptable.

One problem which has not yet been discussed involves the fundamental fact that the multi-access system normally permits simultaneous 'reads' and 'writes' at the same memory location or storage cell. Consequently, to avoid erroneous storage and retrieval, it is necessary to protect against the possibility of simultaneous access to a location that is being altered by a write operation. The Table of FIG. 4 is provided to show the possible error conditions for one location in a two-channel memory module. The need is to provide for the detection of the conflict so that decisions can be made regarding which channel is to have priority. With regard to Table 4, if, for example, two of the address registers each contain identical module or cell location instructions and if both instructions mandate a 'read' operation, there is no conflict or "Error" since the state of the cells located by the instruction can be read simultaneously through a pair of channels. In other words, the state of each located cell, such as cell 2 of FIG. 2, can be read into the separate buffer registers, such as $MB_1$ and $MB_2$, through the separate bit line circuits. More specifically, switches 12 of both bit line circuits will close to access the storage cell data into the separate registers. If, however, one of the identical location instructions calls for a 'write' operation and the other for a 'read' operation, there obviously is a so-called conflict or "Error" in the sense that some decision is needed to determine whether to read before or after the cell state is altered by the write operation. As appears in Table 4, this read-write situation produces an "Error." Similarly, there is an "Error" or conflict situation in the two addresses under consideration if both call for a write operation at the same memory location. This conflict arises because the two write operations may alter the state of the cells in different manners. Consequently, there is a need in any multi-access or multi-channel system to assign a priority to the conflicting addresses. Such a priority can be assigned in any desired manner such as, for example, by selecting the lowest numbered address to achieve what amounts to a first-in, first-out effect. Alternatively, a write operation can, if desired, be routinely accorded priority.

Once the conflict is detected, the response to it is dependent on the programmer's intent and the system in which the memory is employed. Since these factors are variable, the principal concern of the present system becomes one of providing a suitable error detection capability so that the desired corrective action can be taken. This requirement can be satisfied by use of the comparison logic circuitry of FIG. 5. In general, a conflict is detected between any two channels by comparing their addresses and by examining the status of their read-write bit. It should be noted that the present system uses a comparator between all possible pairs of address registers 3 so that the address instructions of each register is compared with that of every other register of the system. Thus, as shown in FIG. 5, the comparator is comparing the addresses from, for example, $MA_1$ and $MA_2$. Each address includes address bits numbered $1_r, 2_r, - n$, and a read-write bit identified by numerals 20 and 21. Since any two channels can be in conflict during a single memory cycle, a comparison should be made between the addresses of all possible pairs of channels. This can be performed in parallel over all C channels if the conflict hardware exists between each of the C!/2(C-2)! pairs of channels, i.e., factorial designation.

The FIG. 5 comparator detects the error by comparing each of the bits $1, -n$, in an exclusive 'OR' gate 22 and by applying the outputs of gates 22 to a 'NOR' gate 23 along with the output of another 'NOR' gate 24 which compares read-write bits 20 and 21. The result, as will be apparent in a truth table, is that gate 24 produces an error output for all conflicting conditions described in the FIG. 4 Table. More specifically, the gating arrangement achieved by the exclusive "OR" and the "NOR" gates is such that, when the read-write bits applied to gates 24 are different (1 and 0) or when both are "1" (write), "NOR" gate 23 produces a signal error. Consequently, as will be apparent, gate 24 produces an error signal under the conditions expressed the FIG. 4 Table since, according to Table 4, the bits 20 and 21 will be different ("1" and "0") when one mandates a read and the other a write. If both mandate a write, the write is a "1" in both 20 and 21 so that, again, NOR gate 23 produces an error signal to conform with Table 4. If both are "0" or 'read', there is no error and the "NOR" gate does not have an error signal output. As will be understood, the FIG. 5 comparator basically provides coincidence circuitry designed to produce a desired result under the noted error conditions and, of course, it can be implemented by other gating arrangements or in other desired manners.

Once the error is detected, the matter of resolving location conflicts requires a decision as to which channel has priority. If the earliest arrival is to be serviced, first requests can be assigned to channels according to their order of arrival with the earliest request going to the lowest numbered channel. The higher numbered channel then is denied access until the lower numbered channel is serviced. By using this procedure to resolve the conflicts between each pair of channels, conflicts can be resolved between any and all of the C channels. As shown in FIG. 1, the system includes 'Conflict Resolve Logic' to make the desired decision and permit the addressed or the selected channel to be energized. However, with regard to this 'Conflict Resolve Logic,' as well as the FIG. 5 comparator, it should be noted that the present invention is not directly concerned with the problem of resolving concurrent read-write or write conflicts. Instead, its primary emphasis is directed only to the so-called multi-access principle regardless of whether such conflicts are resolved or how they are resolved. As is known to the art, such conflicts can be resolved in proce-sor 10 prior to their entry into the present multi-access memory system. In such an event there would be no need for either the comparator or the Conflict Resolve Logic. If desired, a more detailed description of the Conflict Resolve Logic and the FIG. 5 comparator is provided in a publication "A Multi-access Memory" P. B. Korff, of May 20, 1976, DDC Technical Report, Accession A DD 003549 and a similar Report by the same author "A Multi-access Memory," July 1976, UCLA Eng. -7607(NSF)-OCA-MCS 7203633-76064.

Since memory requests must first be checked for conflicts before being granted access to storage, there is a delay associated with each memory access. To maintain a high utilization of the memory module, the detection and resolution easily can be overlapped with memory access. Furthermore, in a multiprocessor environment, it is possible for a processor that is generating frequent conflicts to keep a number of channels busy and, therefore, delay the servicing of memory requests from other processors. This makes it possible for one program to increase the execution time of other programs. If these problems prove to be significant, potential conflicts can be detected and resolved before requests are sent to the memory. In other words, if the situation justifies it, conflicts can be resolved at the processor rather than by directly comparing the addresses and resolving at the memory itself.

A study has been made of multi-access performance and the results demonstrate significant improvements. First, the expected memory response time increases as the memory utilization increases. Further, for a given level of memory utilization and for a given type of memory request arrivals, the expected response time decreases as the number of access channels increase. This fact implies that a C channel multi-access memory not only yields C times the throughput of a single memory channel but also provides a reduction in response time which brings significant advantages. Further, for a multi-access memory to achieve the same response time as that of the single channel memory system, a higher memory utilization and thus throughput can be supported by the multi-access memory system. For example, it has been shown that a two-channel multi-access memory system supports a greater memory utilization and more than twice the input traffic as compared with a single channel system.

An additional attribute of multi-access is its fault-tolerant capability. If, as is true, the channels are independent and channel failure detection techniques are included, then in the event of the inoperativeness of a channel, the stored data nevertheless can be accessed via the remaining channels. The system thus can continue to function with a somewhat degraded performance.

It is recognized that LSI fabrication for multi-access purposes may present some problems. For example, such factors as pin limitation, wafer area and power dissipation may all affect the number of accessing channels. However, even if such matters may at the moment present some limitations, the rapid advances in semiconductor fabrication soon can be expected to resolve such difficulties and, in any event, the system is itself entirely workable and has demonstrated its significant improvements.

Obviously many modifications and variations of the present invention as possible in the light of the above teachings. It is therefore to be understood that within the scope of the appended claims the invention may be practiced otherwise as specifically described.

We claim:

1. Multi-access memory apparatus for use with a digital data computer system of a type having a memory formed of a plurality of memory modules each containing data bit storage cells, the computer system further including a digital data processor providing address instructions to address registers, the outputs of which are applied to decoders functioning responsively to said instructions to activate particular storage cells of a particular module and permit the logic state of said particular cells to be supplied for storage to memory buffer registers, the memory apparatus comprising:

a plurality of independent memory access channels for each of said data bit storage cells of each of the modules, each of said channels including:
  an address register having an input coupled to said processor for receiving said processor provided address instructions and an output,
  an address instruction decoder having an input coupled to said address register output and an output,
  an individual electrically-conductive drive line coupled to and electrically activated by said decoder output,
  an individual memory buffer register for receiving the logic contents of the storage cell of the channel,
  a normally-open data-bit-line circuit coupling said buffer register to said data bit storage cell of the channel,
  said data-bit-line circuit including a normally-open switch means, and
  conductive means coupling said drive line to said normally-open switch means when said decoder functions for activating the drive line, said activating closing said switch means and permitting said logic state of said cell to be supplied through said data-bit-line circuit to said buffer register,
  said plurality of channels for each cell permitting simultaneous accessing of the logic state of said cell whereby identical address instructions calling for the same storage cell locations can be simultaneously serviced.

2. The apparatus of claim 1 wherein said data bit storage cell is a bi-stable multivibrator having Q and $\overline{Q}$ terminals and wherein said individual buffer register is coupled to the cell by a "0" and "1" pair of normally-open data-bit-line circuits,
  said pair each including a normally open switch means activated by a single drive line means.

* * * * *